United States Patent [19]

Shin'e

[11] Patent Number: 4,992,757
[45] Date of Patent: Feb. 12, 1991

[54] DIFFERENTIAL AMPLIFYING CIRCUIT

[75] Inventor: Toshifumi Shin'e, Tokyo, Japan

[73] Assignee: NEC Corp., Japan

[21] Appl. No.: 412,669

[22] Filed: Sep. 26, 1989

[30] Foreign Application Priority Data

Sep. 26, 1988 [JP] Japan ................... 63-242055

[51] Int. Cl.$^5$ ............................................. H03F 3/45
[52] U.S. Cl. ................................... 330/254; 307/555; 307/562; 307/567
[58] Field of Search ............... 330/252, 254; 307/555, 307/562, 567

[56] References Cited

U.S. PATENT DOCUMENTS 4,284,912  8/1981  Fujisaki et al. .................. 330/254 X Primary Examiner—James B. Mullins
Attorney, Agent, or Firm—Ostrolenk, Faber, Gerb & Soffen

[57] ABSTRACT

A differential amplifying circuit comprises a differential pair of transistors for differentially amplifying input signals, and an output signal fixing transistor for fixing output signals to avoid the transmission of extraordinary input signals from input terminals to output terminals. The output signal fixing transistor is connected to one of the differential pair of the transistors which is thereby connected to the ground, where extraordinary input signals are supplied to the input terminals. A capacitor element such as a transistor having the same parasitic capacitance as the output signal fixing transistor is connected to the remaining one of the differential pair of the transistors, such that capacitances of the same value are loaded to the differential pair of the transistors. As a result, no offset occurs between the output signals, and wave forms of the output signals are equal to each other.

3 Claims, 2 Drawing Sheets

DIFFERENTIAL AMPLIFYING CIRCUIT

FIELD OF THE INVENTION

This invention relates to a differential amplifying circuit and, more particularly, to a circuit for fixing output signals of a differential amplifier.

BACKGROUND OF THE INVENTION

A conventional differential amplifying circuit comprises a differential pair of transistors for amplifying input signals, and a transistor for fixing output signals of the differential amplifier, wherein collectors of the differential pair of the transistors are commonly connected through resistances to a power supply and directly to output terminals, emitters thereof are commonly connected through a resistance to the ground, and bases thereof are connected to input terminals, respectively, while the output signal fixing transistor is connected, in collector to collector and emitter to emitter, to one of the differential pair of the transistors, and a base thereof is connected to a control unit.

In operation, input signals which are out of phase are supplied to the input terminals connected to the bases of the differential pair of the transistors, so that the input signals are differentially amplified therein to provide amplified output signals which are out of phase between the output terminals connected to the collectors of the differential pair of the transistors. Where extraordinary input signals are applied to the input terminals, a high level control signal is supplied from the control unit to the base of the output signal fixing transistor. Consequently, the output signal fixing transistor is turned on, so that one of the differential pair of the transistors is connected through its own collector and the output signal fixing transistor to the ground. Thus, the output signals which are out of phase are fixed to avoid the transmission of the extraordinary input signals to the output terminals.

However, the conventional differential amplifying circuit has a disadvantage in that an offset occurs between the output signals due to imbalance of loads induced between the differential pair of the transistors, because a parasitic capacitance produced between the collector and the emitter of the output signal fixing transistor is loaded to one of the pair transistors, to which the output signal fixing transistor is connected, where the output signal fixing transistor is turned off in the ordinary state. The conventional differential amplifying circuit has a further disadvantage in that wave forms of the output signals are different from each other, since one of the output signals is delayed in rising-up and falling-down times relative to the other due to the parasitic capacitance. Consequently, an inverted signal which is one of the output signals does not become equal in absolute value to a positive-phase-sequence signal which is the remaining one of the output signals.

SUMMARY OF THE INVENTION

Accordingly, it is an object of this invention to provide a differential amplifying circuit in which loads applied to a differential pair of transistors become balanced to avoid the occurrence of an offset between output signals.

It is a further object of this invention to provide a differential amplifying circuit in which wave forms of output signals which are out of phase are equal to each other.

According to the invention, a differential amplifying circuit, comprises:
- a differential pair of transistors for differentially amplifying input signals supplied thereto;
- an output signal fixing transistor for fixing output signals supplied from the differential pair of the transistors, the output signal fixing transistor being connected to on of the differential pair of the transistors;
- a capacitance element having the same capacitance value as a parasitic capacitance of the output signal fixing transistor, the capacitance element being connected to the remaining one of the differential pair of the transistors; and
- a control unit for supplying the output signal fixing transistor with a control signal, the output signal fixing transistor being turned on by receiving the control signal, whereby the one of the differential pair of the transistors is connected to the ground, thereby fixing the output signals supplied from the differential pair of the transistors.

BRIEF DESCRIPTION OF THE DRAWINGS

The invention will be explained in more detail in conjunction with appended drawings, wherein.

DESCRIPTION OF THE PREFERRED EMBODIMENT

Before explaining a differential amplifying circuit in a preferred embodiment according to the invention, the aforementioned conventional differential amplifying circuit will be explained.

Figure 1:
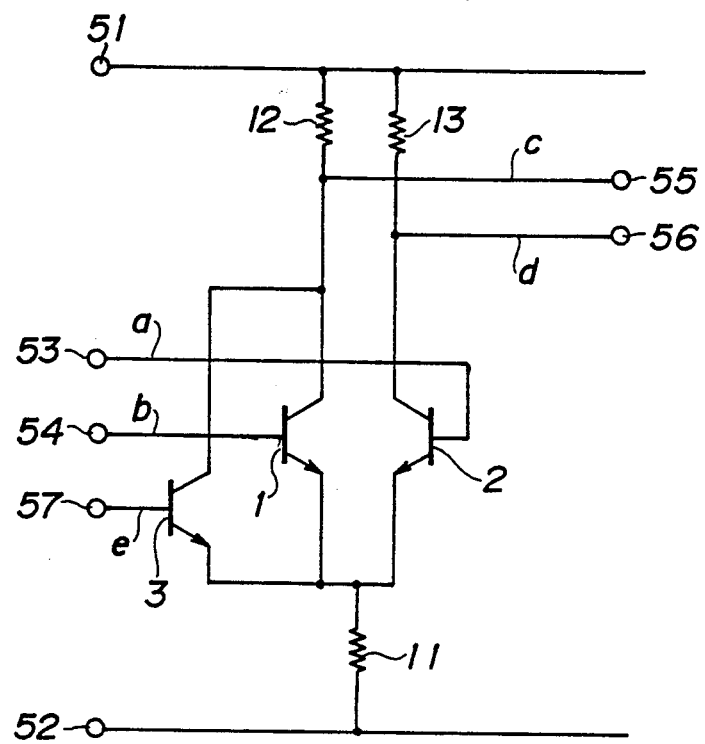
FIG. 1 is a circuitry diagram showing a conventional differential amplifying circuit.

FIG. 1 shows the conventional differential amplifying circuit which comprises a differential pair of transistors 1 and 2, and an output signal fixing transistor 3. Collectors of the transistors 1 and 2 are connected through resistances 12 and 13 to a power supply terminal 51 and directly to output terminals 55 and 56, emitters of the transistors 1 and 2 are connected through a common resistance 11 to a ground terminal 52, and bases of the transistors 1 and 2 are connected to input terminals 53 and 54. The transistor 3 is connected, in collector to collector and emitter to emitter, to the transistor 1, and a base of the transistor 3 is connected to a control terminal 57, to which a control signal is supplied from a control unit (not shown).

In operation, where a low level control signal e is supplied from the control unit to the control terminal 57 in the ordinary state, the transistor 3 is turned off. In this circumstance, input signals a and b which are out of phase are supplied to the input terminals 53 and 54, and then differentially amplified in the differential pair of the transistors 1 and 2, so that output signals c and d which are out of phase are obtained at the output terminals 55 and 56. As explained before, a parasitic capacitance produced between the collector and the emitter of the transistor 3 is loaded to the transistor 1. As a result, the conventional differential amplifying circuit suffers from the aforementioned disadvantages.

Figure 2:
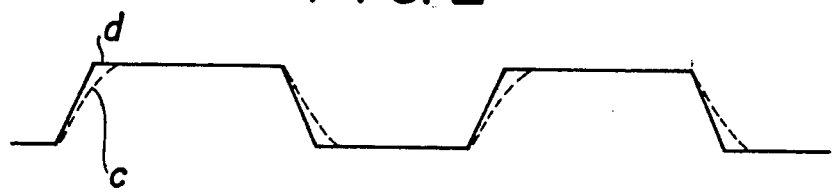
FIG. 2 is a wave form diagram showing output signals in the differential amplifying circuit of FIG. 1.

FIG. 2 shows the delay of rising-up and falling-down times of the output signal c relative to the output signal d, which is resulted from the parasitic capacitance.

Where extraordinary input signals a and b are supplied to the input terminals 53 and 54, a high level control signal e is supplied from the control unit to the control terminal 57 to turn the transistor 3 on, so that the output signal c is fixed to be "low", and the output signal d is fixed to the "high". As a result, the extraordinary input signal is not transmitted to the output terminals 55 and 56.

Figure 3:
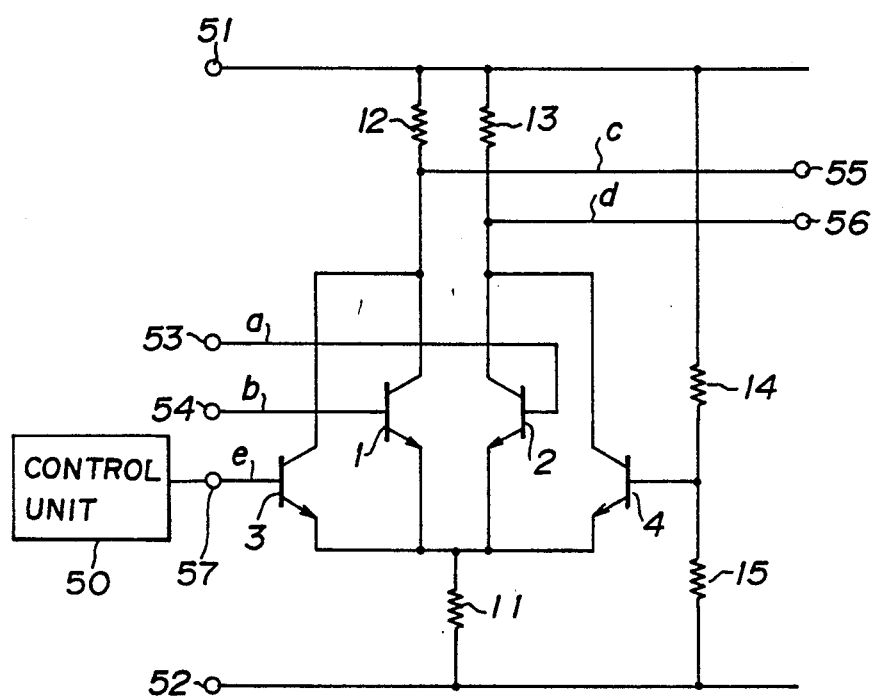
FIG. 3 is a circuitry diagram showing a differential amplifying circuit in a preferred embodiment according to the invention.

Next, a differential amplifying circuit in the preferred embodiment according to the invention will be explained in FIG. 3, wherein like parts are indicated by like reference numerals as in FIG. 1, except that a transistor 4 is additionally provided to be connected, in collector to collector and emitter to emitter, to the transistor 2, and resistances 14 and 15 having a connecting point connected to a base of the transistor 4 are provided between two lines connected to the power supply terminal 51 and the ground terminal 52.

Figure 4:
FIG. 4 is a wave form diagram showing output signals in the differential amplifying circuit of FIG. 3.

In operation, input signals a and b which are out of phase are supplied through the input terminals 53 and 54 to the bases of the differential pair of the transistors 1 and 2, and differentially amplified therein in the presence of the collector resistances 12 and 13, so that output signals c and d which are out of phase are obtained at the output terminals 55 and 56. At this time, the transistor 3 is turned off due to a low level control signal e from a control unit 50 applied to the base thereof. In addition, the transistor 4 is turned off all time, since a voltage divided by the resistances 14 and 15, which is applied to the base of the transistor 4, is less than a threshold voltage for the transistor 4. Therefore, the transistors 1 and 2 are loaded by parasitic capacitances, respectively, having the same value as each other based on the turned-off transistors 3 and 4. As a result, wave forms of the output signals c and d are identical to each other, as shown in FIG. 4, and no offset occurs between the output signals c and d.

On the other hand, where extraordinary input signals a and b are supplied to the input terminals 53 and 54, the control unit 50 detects the extraordinary input and then a high level control signal e is supplied from the control unit 50 to the control terminal 57, so that the transistor 50 is turned on. Therefore, the output signal c is fixed to be "low", and the output signal d is fixed to be "high", so that the extraordinary input signals a and b are not transmitted to the output terminals 55 and 56.

In the preferred embodiment, the transistor 4 may be replaced by an appropriate capacitor element.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A differential amplifying circuit, comprising:
   a differential pair of transistors for differentially amplifying input signals supplied thereto;
   an output signal fixing transistor for fixing output signals supplied from said differential pair of transistors, said output signal fixing transistor being connected to one of said differential pair of transistors;
   a capacitance element having the same capacitance value as a parasitic capacitance of said output signal fixing transistor, said capacitance element being connected to the other of said differential pair of transistors; and
   a control unit for supplying said output signal fixing transistor with a control signal, said output signal fixing transistor being connected to said one of said differential pair of transistors, such that when said output signal fixing transistor is turned on the output of said one of said differential pair of transistors is maintained at a first voltage value while the output of the other of said differential pair of transistors is maintained at a second, different voltage value.

2. A differential amplifying circuit, according to claim 1, wherein:
   said capacitance element is a transistor having a parasitic capacitance having the same value as said parasitic capacitance of said output signal fixing transistor, said transistor having said parasitic capacitance being maintained to be turned off.

3. A differential amplifying circuit, according to claim 2, further comprising:
   first and second resistances connected in series between a predetermined potential point and ground potential, the connecting point of said first and second resistances being connected to a base of said transistor of said parasitic capacitance to apply a predetermined voltage to said base of said transistor of said parasitic capacitance.

* * * * *